United States Patent [19]

Flor et al.

[11] 4,200,675
[45] Apr. 29, 1980

[54] SHEET FOR TITLING LIGHT-SENSITIVE MATERIAL

[75] Inventors: Lawrence A. Flor, Anoka; Kenneth R. Kurttila, Grant Township, Washington County, both of Minn.

[73] Assignee: Minnesota Mining and Manufacturing Company, St. Paul, Minn.

[21] Appl. No.: 915,978

[22] Filed: Jun. 16, 1978

[51] Int. Cl.² .................. B05C 17/08; B41L 13/02; B41N 1/24
[52] U.S. Cl. ................................ 428/43; 101/127.1; 430/5; 282/28 R; 400/544; 428/914; 428/523
[58] Field of Search .............. 428/914, 43, 500, 523; 427/153, 146; 400/193, 205, 205.1, 522, 544; 282/1 R, 14, 19, 28 R; 101/128.2, 128.3

[56] References Cited

U.S. PATENT DOCUMENTS

| | | | |
|---|---|---|---|
| 1,261,516 | 4/1918 | Haddock | 428/43 X |
| 2,016,599 | 10/1935 | Graves | 428/914 X |
| 3,123,384 | 3/1964 | Baker | 282/1 R |
| 3,789,756 | 2/1974 | Weber | 282/28 R X |
| 3,973,788 | 8/1976 | Pekko et al. | 282/1 R X |
| 4,092,280 | 5/1978 | Barouh et al. | 428/914 X |

FOREIGN PATENT DOCUMENTS

| | | | |
|---|---|---|---|
| 514211 | 6/1955 | Canada | 282/28 R |
| 224974 | 4/1943 | Switzerland | 400/205 |

Primary Examiner—George F. Lesmes
Assistant Examiner—Alexander S. Thomas
Attorney, Agent, or Firm—Cruzan Alexander; Donald M. Sell; John C. Barnes

[57] ABSTRACT

A sheet suitable for making typewriter producible negatives to impart an identifying title to light-sensitive material which comprises an opaque sheet formed with a narrow rectangular area defined by spaced parallel perforations in the sheet affording removal of the sheet material from the rectangular area and a carbon ribbon secured to the sheet such that typing on the ribbon transfers the carbon to the removable sheet material in the rectangular area affording transparent areas in the ribbon defining the indicia desired for the title.

5 Claims, 3 Drawing Figures

SHEET FOR TITLING LIGHT-SENSITIVE MATERIAL

BACKGROUND OF THE INVENTION

This invention relates to a structure for rapidly and easily producing title sheets which may be placed in a document filming camera to place a title area on the film.

Cameras which are used to photograph documents and reduce the same to a microfiche record are desirably provided with some method for applying a title along one marginal edge of the microfiche for visually identifying the subject matter of the documents on the microfiche.

Prior to the present invention these titles were most conveniently produced by a method including typing of the desired title on a piece of white bond paper. This typed image was then placed in contact with an intermediate, dual spectrum copy sheet, sold commercially by Minnesota Mining and Manufacturing Company of St. Paul, Minn., as "3M Brand" Type 676. This composite was exposed in a copy machine such as the Minnesota Mining and Manufacturing Company Model 411 Copier. After exposure, the intermediate was separated from the bond paper and placed in contact with a receptor sheet which would produce a negative transparency of the indicia that had been typed on the bond paper. The receptor material was "3M Brand" Type 678 sheet material which when placed in contact with the intermediate and developed by heat would produce transparent areas in the receptor sheet corresponding to the indicia typed onto the bond paper. The imaged areas on the receptor sheet were then cut from the sheet and mounted on a title mask which could be placed in registration on a tray and placed in the camera to be in contact with the photosensitive material to impart the image to the photosensitive material by contact exposure through the negative formed by the receptor sheet onto the photosensitive material. This multistep operation to provide the tilting thus required the purchase or availability of a dual spectrum copy machine together with a sheet of bond paper, a sheet of intermediate, and a receptor sheet to form the title negative which could be exposed to the photosensitive material. This was a time-consuming and quite expensive titling system.

The present invention makes the production of the title negative substantially a one-step operation and reduces the cost of making and the time for making the identifying title negative.

The present invention provides a system of pigment transfer which results in the production of a negative title strip. Other structures are known wherein pigment transfer has been utilized to make identifying labels or to make stencil sheets. An example of these systems is shown in U.S. Pat. No. 3,123,384, issued Mar. 3, 1964, to R. Baker. This patent discloses a personalized label kit wherein a pressure-sensitive label is disposed under a thin flexible sheet made of paper or plastic having a layer of an image-transferring substance such as a very thin layer of gold. Thus, a transfer of the coating to the label stock may be made by a smooth pointed object such as a pencil point or the point of a ballpoint pen against the thin sheet opposite the coating of transferring substance. This patent however fails to teach the production of a negative which would afford the title sheet described by the present invention.

U.S. Pat. No. 2,970,931, issued Feb. 7, 1961, to R. Gumbinner discloses a stencil sheet having a base tissue, a pastel-colored stencilable coating on one surface of the base tissue and having a coating of dark impression-transmitting coating to a backing sheet. This does not disclose the production of a title-producing negative.

U.S. Pat. No. 3,973,788, issued Aug. 10, 1976, to J. Pekko et al, discloses a label-producing construction wherein a pigment is transferred from a layer of material positioned opposite one surface of a film such that by impression against the carbon paper the letter will be transferred to the image-receptive coating in the window area of a film. This affords the production of pressure-sensitive labels where the image-forming pigment is protected by the film and visible through the film. This in essence may constitute the production of a positive imaging label, but there is no teaching again of the present invention.

SUMMARY OF THE INVENTION

The present invention provides a sheet from which a typewriter-producible negative can be formed for use as a titling device for imparting a title to light-sensitive material to expose thereon a selected title. The titling sheet comprises an opaque sheet of card stock formed with a rectangular area defined by spaced parallel perforations in the card stock, a strip of ribbon disposed on one surface of the card stock and overlaying the rectangular area with the pigment coated surface of the ribbon in contact with the card. The ribbon is secured to the card as by the use of a strip or strips of pressure-sensitive adhesive tape. The card is provided on the surface thereof on which the ribbon is mounted with indicia to permit proper spacing of the letters forming the title to improve the appearance thereof and the sheet is provided with a plurality of apertures affording vertical registration of the indicia and locating holes to place the sheet in proper registration in the camera. These holes are positioned at placed points adjacent the ends of the rectangular area.

BRIEF DESCRIPTION OF THE DRAWINGS

The invention will be further described with reference to the accompanying drawings wherein.

DETAILED DESCRIPTION OF THE PRESENT INVENTION

Figure 1:
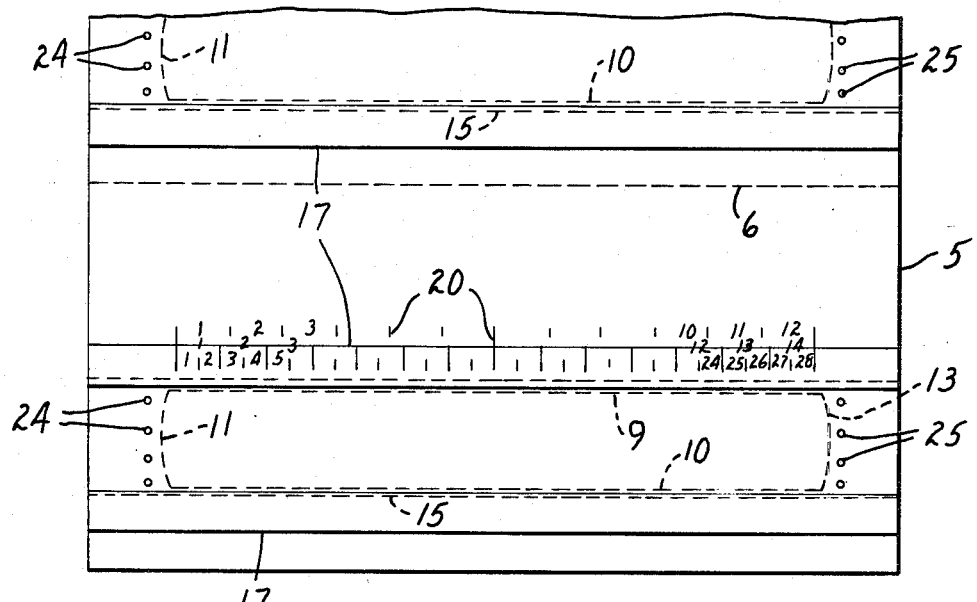
FIG. 1 is a fragmentary plan view of a title sheet constructed according to the present invention.
Figure 2:
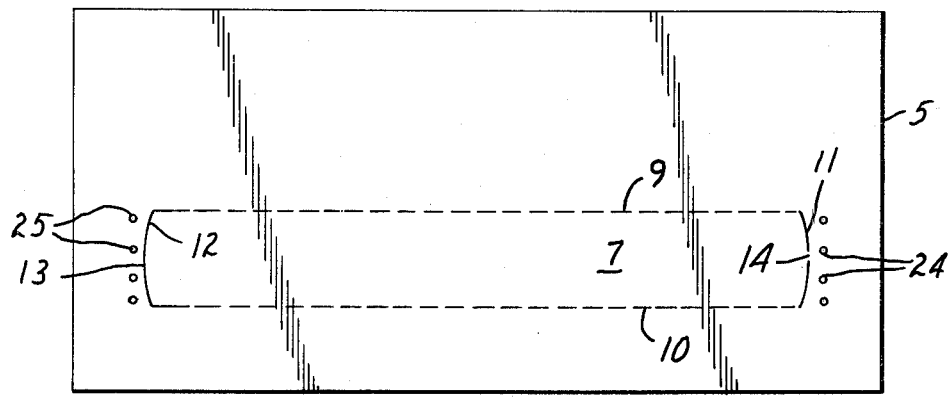
FIG. 2 is a bottom view of a single title sheet of the segmented sheet of FIG. 1.

The title sheet of the present invention is readily adaptable to produce negative titling masks for use in contact exposure of photo-or light-sensitive material to produce thereon the desired identifying title. The titling sheet 5 comprises at least one rectangular sheet of opaque card stock, preferably high gloss label stock, which may have a size of approximately 8.25 centimeters by 14.3 centimeters and is 6 to 14 mils thick, preferably 10 to 12 mils. The sheet 5 may be joined to other sheets along a perforation 6 such that a plurality of the title sheets form what may also be referred to herein as the title sheet. The sheet 5 is provided with a rectangular area defined between two parallel spaced rows of perforations 9 and 10 and transverse cuts 11 and 12. The transverse cut 12 as formed is a smooth curve with an edge 13 projecting beyond the ends of the perforations 9 and 10 to form a tab affording the facile gripping of the card stock in the rectangular area such that the same may be torn or peeled along the perforations 9 and 10 to remove the same from the sheet 5. The cut 11 is perforated leaving the tip 14 to be the last area to be broken away from the sheet 5.

When the area 7 has been removed a long, narrow, rectangular opening 18 is formed in the sheet 5 to expose the coated surface of a ribbon 15.

A strip of ribbon 15 is disposed on a very smooth surface of the card stock and has a width of 2 to 3 centimeters, preferably 2.85 centimeters, to cover the rectangular area 7. The ribbon 15 comprises a transparent backing of polyethylene film of 0.75 to 1.0 mil in thickness coated on one side thereof, the side disposed in contact with the sheet 5, with a releasable opaque pigment coating which may be a carbon coating of a form which is similar to the commercially available material sold as typewriter ribbons such as IBM Company of Armonk, N.Y. 10502, "TECH III" ribbon, of Columbia Ribbon Company, Box 443, Glen Cove, N.Y. 11542 and identified as No. 3311, Columbia Ribbon.

The ribbon for convenience of manufacture annd placement extends the length of the sheet 5 and fully covers the rectangular area 7. The ribbon 15 is secured to the card stock by a single strip of transparent polyester pressure-sensitive adhesive tape which is wider than the ribbon and between 0.75 to 1.0 mil thick. Alternatively, as illustrated, the ribbon can be secured to the card 5 by two strips of pressure-sensitive adhesive tape 17, disposed one along each edge of the ribbon 15 and spaced from each other to provide an area for imaging the ribbon opposite the area 7. Other means for securing the ribbon to the sheet may be used such as by heat sealing the carbon ribbon to the paper if the paper were a poly-coated card stock.

Printed index marks, including spaced lines or squares and numerals, are placed along the length of the sheet 5 adajcent the edge of the ribbon 15 and on the surface of the sheet to which the ribbon is secured. The index marks 20 afford proper alignment of the titling information within the opening 13 which will be defined upon removal of the rectangular area 7 from the sheet 5.

A row of spaced aligning or identifying marks are formed in the ribbon 15 adjacent the ends of the rectangular area 7. The identifying marks 24 and 25 are formed beyond the die cut ends 11 and 12 and beyond the lateral extent of the rectangular area 7. The identifying marks are made to contrast with the coating on the tape and this is done by pin pricks in the ribbon backing and tape or by apertures through the ribbon or ribbon and card stock as shown. The marks 24 and 25 are utilized for providing vertical alignment of the indicia to be placed on the ribbon 15 and may also be utilized for locating or registering the sheet 5 within the camera or the title mask which may be provided with one or more locating pins to fit into one of the apertures thus registering the sheet 5 thereon.

Figure 3:
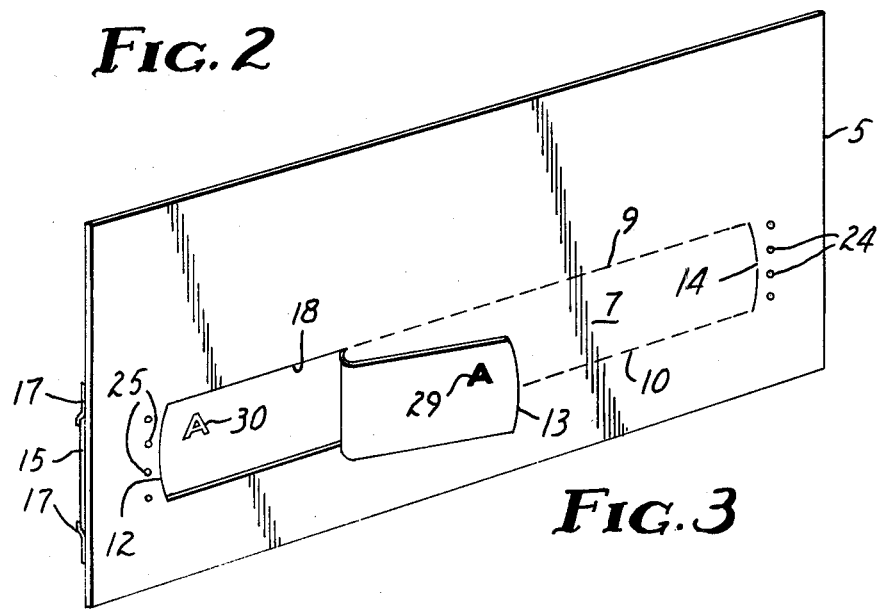
FIG. 3 is a perspective view of a title sheet according to the present invention with indicia imparted thereto.

In use the sheet 5 may be placed in a conventional ubiquitous typewriter and the impact of the typing keys against the tape 17 and/or backing of the ribbon 15 with the typewriter on the stencil setting will transfer the pigment from the ribbon to the rectangular area 7 of the sheet 5. Thus when the rectangular area is peeled from the sheet 5 the ribbon will have a transparent area thereon corresponding to the letter from the typewriter and affording an image area which can be imparted to the light-sensitive film when placed in contact therewith and light exposed by a lamp through the ribbon toward the light-sensitive material. Thus the transfer of pigment 29 from the ribbon 15 produces indicia 30 as indicated in FIG. 3 and produces a negative image on the sheet 5.

The transfer of the pigment may also be afforded by a ballpoint pen or other stylist type of an instrument, however the appearance of the same will depend upon the neatness of the printer.

Placing a transparent cover sheet on the back of the sheet 5 or placing the sheet 5 in a transparent envelope will protect the title legend. Alternatively, after the ribbon backing area 7 is removed from the sheet, a piece of transparent pressure-sensitive tape can be placed over the coated side of the ribbon to preserve a title sheet.

What is claimed is:

1. A titling sheet for use in producing any selected title to be imparted to light-sensitive material to expose thereon the selected identifying title comprising
   an opaque sheet of card stock formed with a rectangular area defined by spaced parallel perforations in the card stock affording facile removal of the card stock within that area;
   a strip of ribbon, comprising a transparent backing of polyethylene film 0.75 to 1.0 mil in thickness and a coating of transferable opaque pigment material, disposed on said card stock with the coated surface overlaying and contacting said area defined by said perforations;
   means securing said ribbon to said card stock whereby pressure on said transparent backing will transfer pigment material from the coated surface of said ribbon to said card stock and removal from said ribbon upon the peeling of the area of card stock between said perforation from the card affording transparent areas in said ribbon defining the desired indicia.

2. A sheet according to claim 1 wherein said ribbon is secured to said card stock by pressure-sensitive adhesive tape contacting said sheet of card stock and at least marginal edges of said ribbon.

3. A sheet according to claim 1 wherein index marks are printed on said card stock adjacent one edge of said ribbon for alignment of indicia on said ribbon opposite said area defined by said perforations.

4. A sheet according to claim 1 wherein said sheet includes identifying marks on the ribbon adjacent the ends of the rectangular area defined by said perforations.

5. A sheet according to claim 4 wherein an end of the rectangular area is cut to afford facile removal of the card stock within said perforations.

* * * * *